(12) United States Patent
Shiu et al.

(10) Patent No.: US 8,890,191 B2
(45) Date of Patent: *Nov. 18, 2014

(54) CHIP PACKAGE AND METHOD FOR FORMING THE SAME

(76) Inventors: Chuan-Jin Shiu, Zhongli (TW);
Po-Shen Lin, New Taipei (TW);
Yi-Ming Chang, Pingzhen (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/536,628

(22) Filed: Jun. 28, 2012

(65) Prior Publication Data

US 2013/0001621 A1 Jan. 3, 2013

Related U.S. Application Data

(60) Provisional application No. 61/503,468, filed on Jun. 30, 2011.

(51) Int. Cl.
*H01L 33/00* (2010.01)
*H01L 21/00* (2006.01)
*H01L 27/146* (2006.01)

(52) U.S. Cl.
CPC ...... *H01L 27/14618* (2013.01); *H01L 27/1463* (2013.01)
USPC 257/98; 257/99; 257/E31.122; 257/E33.072; 438/29; 438/72

(58) Field of Classification Search
USPC .................... 257/98, 435, E31.119, E31.122, 257/E31.127, E33.06, E33.073; 438/64, 69
See application file for complete search history.

(56) References Cited

U.S. PATENT DOCUMENTS

| 2004/0147051 | A1* | 7/2004 | Wada | 438/22 |
| 2008/0135279 | A1* | 6/2008 | Ishido | 174/255 |
| 2009/0096051 | A1* | 4/2009 | Sugiyama et al. | 257/435 |
| 2012/0243099 | A1* | 9/2012 | Kaneko | 359/611 |
| 2013/0072615 | A1* | 3/2013 | Muro et al. | 524/406 |

FOREIGN PATENT DOCUMENTS

| CN | 101930986 | 12/2010 |
| WO | WO 2011145742 A1 * | 11/2011 |

* cited by examiner

*Primary Examiner* — William F Kraig
*Assistant Examiner* — Khaja Ahmad
(74) *Attorney, Agent, or Firm* — Liu & Liu

(57) ABSTRACT

An embodiment of the invention provides a chip package which includes: a substrate having a first surface and a second surface; an optoelectronic device formed in the substrate; a conducting layer disposed on the substrate, wherein the conducting layer is electrically connected to the optoelectronic device; an insulating layer disposed between the substrate and the conducting layer; a light shielding layer disposed on the second surface of the substrate and directly contacting with the conducting layer, wherein the light shielding layer has a light shielding rate of more than about 80% and has at least an opening exposing the conducting layer; and a conducting bump disposed in the opening of the light shielding layer to electrically contact with the conducting layer, wherein all together the light shielding layer and the conducting bump substantially and completely cover the second surface of the substrate.

16 Claims, 5 Drawing Sheets

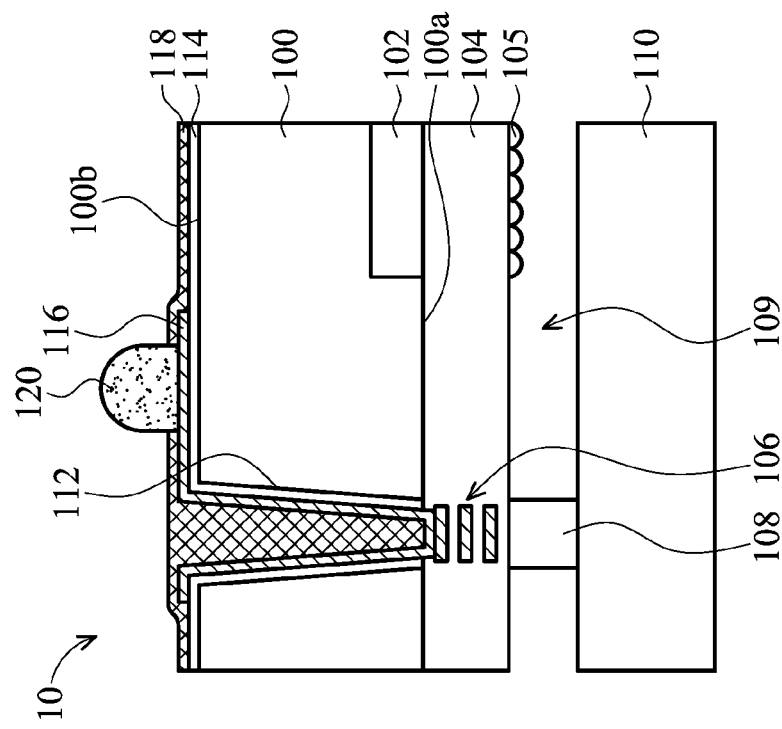
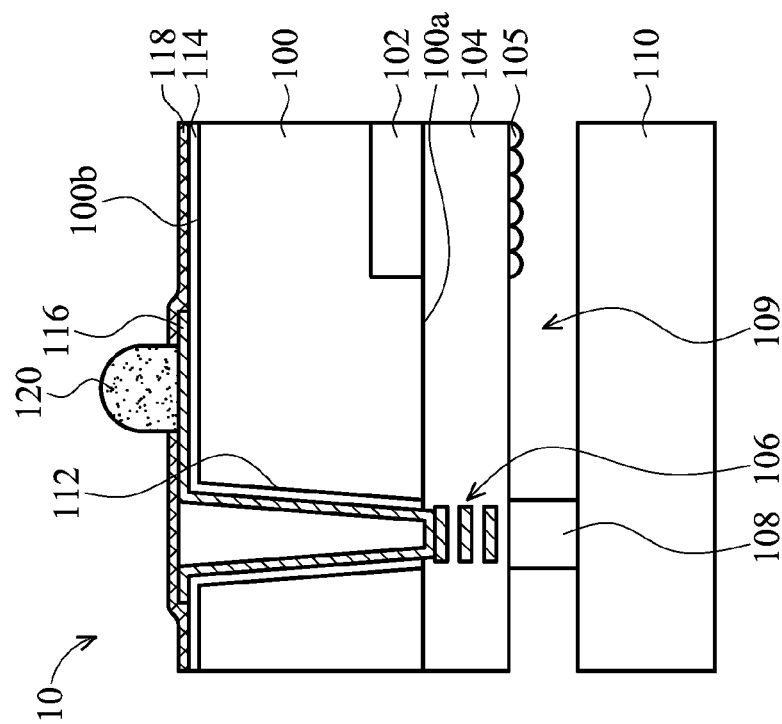

CHIP PACKAGE AND METHOD FOR FORMING THE SAME

CROSS REFERENCE TO RELATED APPLICATIONS

This application claims the benefit of U.S. Provisional Application No. 61/503,468, filed on Jun. 30, 2011, the entirety of which is incorporated by reference herein.

BACKGROUND OF THE INVENTION

1. Field of the Invention

The invention relates to a chip package and fabrication method thereof, and in particular relates to an optoelectronic device chip package and fabrication method thereof.

2. Description of the Related Art

Optical-electronic devices such as light sensing devices or light emitting devices play an important role for image capture or lighting applications. The optical-electronic devices are widely used in electronic products such as digital cameras, digital video recorders, mobile phones, solar cells, screens, illumination elements, and so on.

Along with advancements in technological development, requirements for light sensing precision of light sensing devices or light emitting precision of light emitting devices have increased.

BRIEF SUMMARY OF THE INVENTION

An embodiment of the invention provides a chip package which includes: a substrate having a first surface and a second surface; an optoelectronic device formed in the substrate; a conducting layer disposed on the substrate, wherein the conducting layer is electrically connected to the optoelectronic device; an insulating layer disposed between the substrate and the conducting layer; a light shielding layer disposed on the second surface of the substrate and directly contacting with the conducting layer, wherein the light shielding layer has a light shielding rate of more than about 80% and has at least an opening exposing the conducting layer; and a conducting bump disposed in the opening of the light shielding layer to electrically contact with the conducting layer, wherein alltogether? the light shielding layer and the conducting bump substantially and completely cover the second surface of the substrate.

An embodiment of the invention provides a method for forming a chip package, comprising: providing a substrate having a first surface and a second surface, wherein at least an optoelectronic device is formed in the substrate; forming an insulating layer on the substrate; forming a conducting layer on the insulating layer on the substrate, wherein the conducting layer is electrically connected to the at least an optoelectronic device; forming a light shielding layer on the second surface of the substrate, wherein the light shielding layer directly contacts with the conducting layer and has at least an opening exposing the conducting layer, and the light shielding layer has a light shielding rate of more than about 80%; and forming a conducting bump in the at least an opening of the light shielding layer to electrically connect to the conducting layer, wherein all together the light shielding layer and the conducting bump substantially and completely cover the second surface of the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 3A-3C are cross-sectional views showing the steps of forming a chip package according to an embodiment of the present invention.

DETAILED DESCRIPTION OF THE INVENTION

Figure 1B:
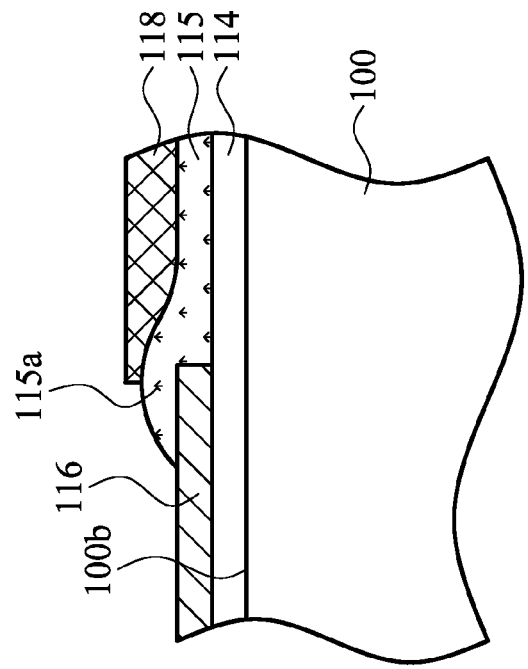
FIGS. 1A and 1B are a cross-sectional view and an enlarged view, respectively, showing a chip package known by the inventor.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package an optoelectronic device such as light sensing devices or light emitting devices. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

Figure 1A:
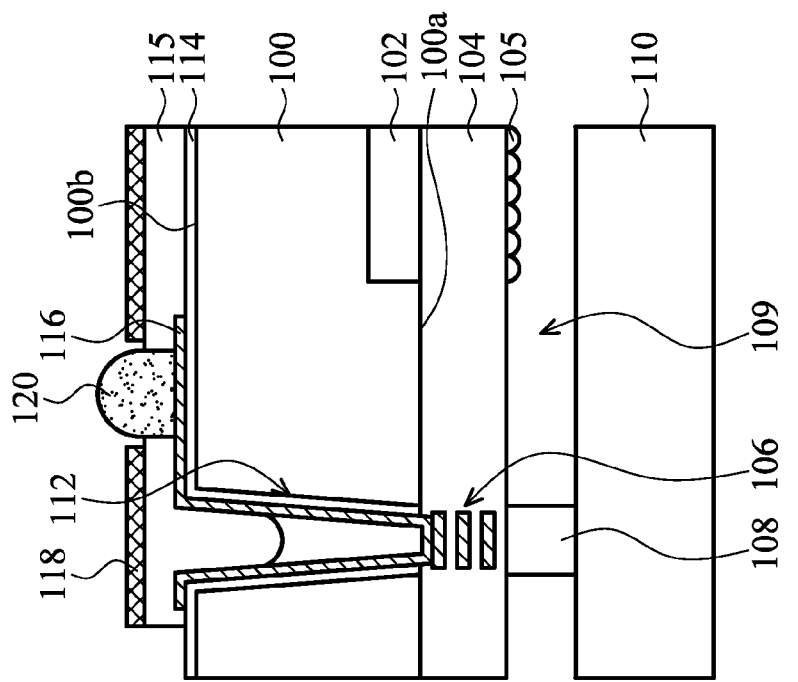

FIGS. 1A and 1B are a cross-sectional view and an enlarged view, respectively, showing a chip package known by the inventor. It should be appreciated that the chip package shown in FIGS. 1A and 1B is merely used to illustrate problems found by the inventor of the application, which is not a commonly known prior art for one skilled in the art.

As shown in FIG. 1A, the chip package may include a substrate 100. An optoelectronic device 102 is formed in the substrate 100. The optoelectronic device 102 may be electrically connected to a conducting pad structure disposed on a surface 100a of the substrate 100 through a wire layer (not shown). The conducting pad structure 106 is disposed in, for example, an insulating layer 104 on the surface 100a of the substrate 100. A substrate 110 may also be disposed on the surface 100a of the substrate 100. The substrate 110 and the substrate 100 may be separated from each other by a spacer layer 108. All together the spacer layer 108, the substrate 100, and the substrate 110 may surround a cavity 109 on the optoelectronic device 102. A lens 105 may be disposed on the optoelectronic device 102. A through-hole 112 may be formed in the substrate 100 which extends from a surface 100b towards the surface 100a, wherein the through-hole 112 may expose the conducting pad structure 106. An insulating layer 114 and a conducting layer 106 may be formed on a sidewall of the through-hole 112. The insulating layer 114 and the conducting layer 116 may extend onto the surface 100b of the substrate 100. A solder resist layer 115 and a conducting bump 120 may be disposed on the surface 100b of the substrate 100. The conducting bump 120 may be electrically connected to the conducting pad structure 106 through the conducting layer 116. A light shielding layer 118 may be disposed on the solder resist layer 115 to prevent outside light from entering the substrate 100 to negatively affect the operation of the optoelectronic device 102.

However, the light shielding layer 118 formed on the solder resist layer 115 may be negatively affected by the solder resist layer 115 such that cracks or voids are formed, allowing outside light to still penetrate the light shielding layer 118 to enter the substrate 100 and negatively affect the operation of the optoelectronic device 102.

FIG. 1B is an enlarged view partially showing the chip package in FIG. 1A. Because the solder resist layer 115 usually has high stress, cracks are easily generated such that cracks are also easily formed in the light shielding layer 118 thereon. Further, as shown in FIG. 1B, because the light shielding layer 118 formed on the conducting layer 116 is usually blanketly formed on the solder resist layer 115, due to the influence of the profile of the material layer thereunder, the light shielding layer 118 located on the conducting layer 116 has a smaller thickness. Thus, cracks or voids are more easily formed. In addition, fillers 115a are often filled in the solder resist layer 115. The filler 115a may cause the light shielding layer 118 to break more easily, which leads to leakage of light. In order to resolve the problem of light leaking to the light shielding layer 118, the inventor of the application provides a novel chip package and the fabrication method thereof in the following description.

Figure 2A:
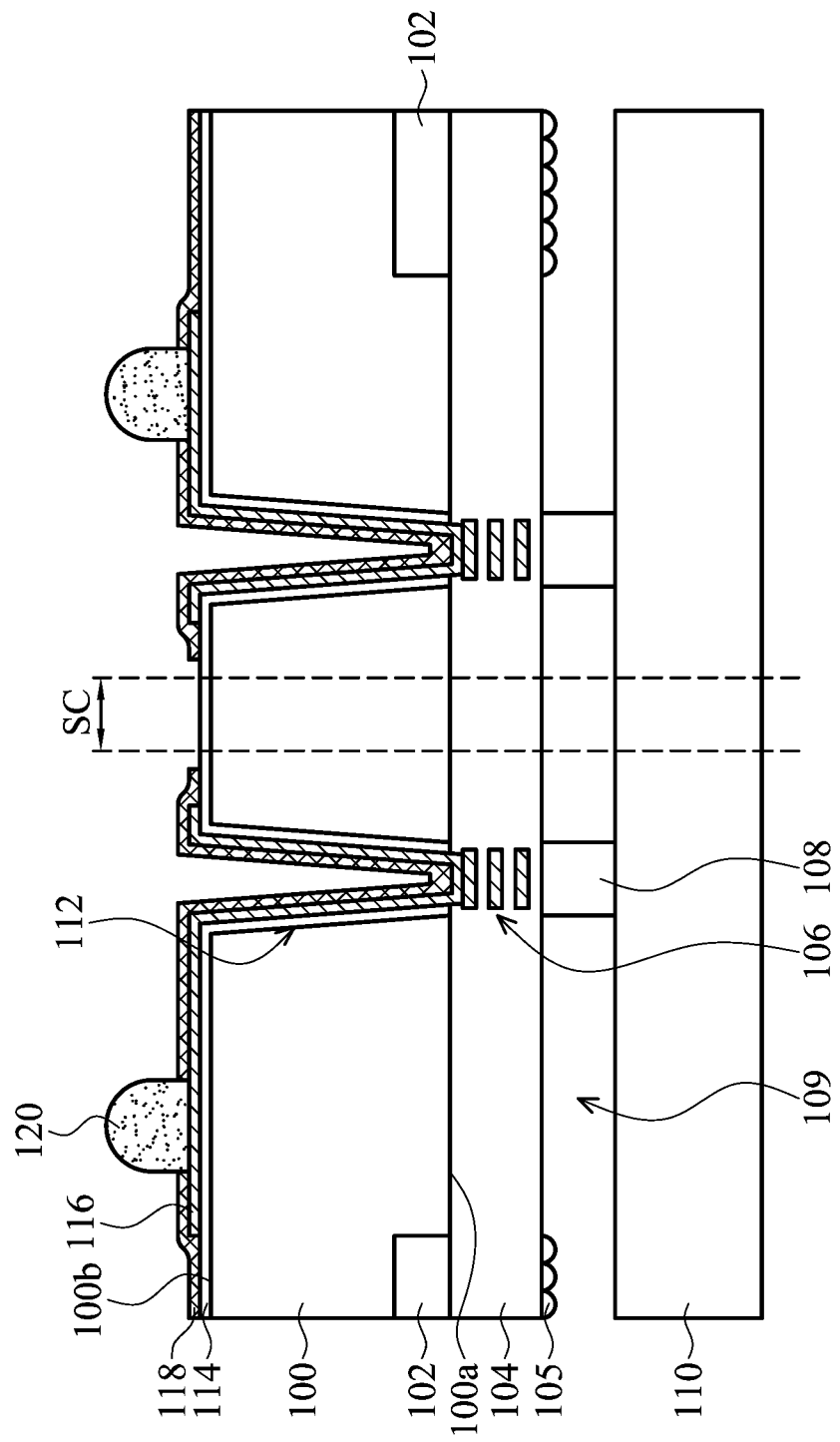
FIGS. 2A-2B are cross-sectional views showing the steps of forming a chip package according to an embodiment of the present invention.
Figure 2B:
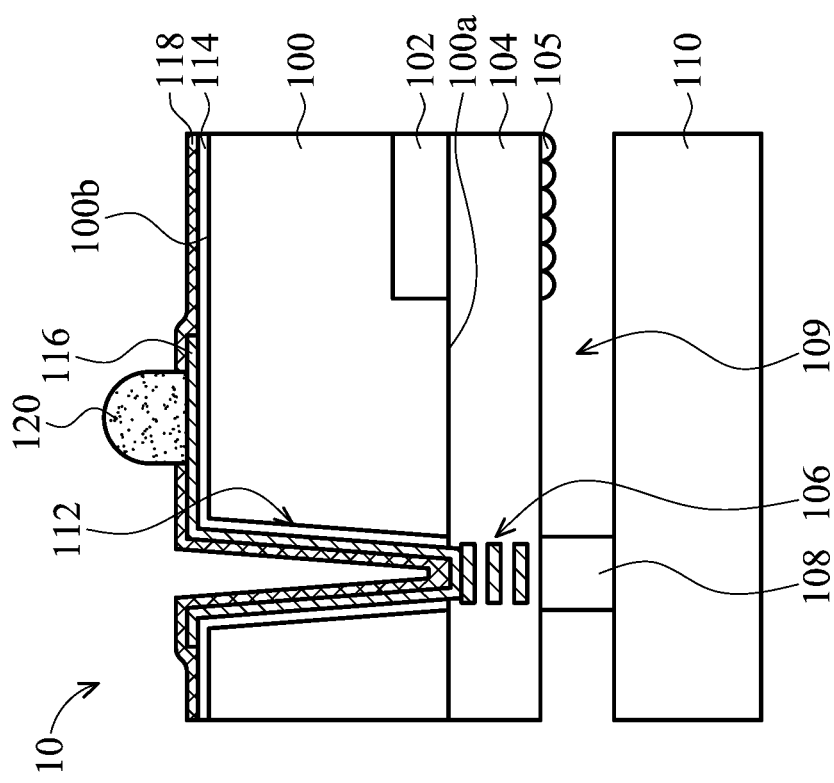

FIGS. 2A-2B are cross-sectional views showing the steps of forming a chip package according to an embodiment of the present invention, wherein same or similar reference numbers are used to designate same or similar elements. The chip package according to the embodiment of the invention may be formed by using, for example, (but is not limited to) a wafer-level packaging process to reduce fabrication cost and time and ensure packaging quality.

As shown in FIG. 2A, a substrate 100 is provided, which is, for example, a semiconductor substrate or a ceramic substrate. In one embodiment, the substrate 100 includes a semiconductor material, which is, for example, a semiconductor wafer (such as a silicon wafer), and a wafer-level packaging process may be performed to reduce the fabrication time and cost. The substrate 100 has surfaces 100a and 100b. The surfaces 100a and 100b are, for example, opposite to each other. The substrate 100 may have a plurality of predetermined scribe lines SC which define the substrate 100 into a plurality of regions. After a packaging process and a dicing process are subsequently performed, each of the regions is packaged in a chip package.

As shown in FIG. 2A, in one embodiment, optoelectronic devices 102 are formed in the substrate 100. The optoelectronic device 102 may include (but is not limited to) an image sensor device or a light emitting device. The image sensor device is, for example, a CMOS image sensor (CIS) device or a charge-coupled sensing device, and the light emitting device is, for example, a light emitting diode device. The optoelectronic device 102 may be electrically connected to, for example, a conducting pad structure 106 in an insulating layer 104 formed on the surface 100a and may be connected to another conducting route through the conducting pad structure 106. The conducting pad structure 106 may be a plurality of conducting pads stacked with each other, a single conducting pad, or a conducting pad structure constructed by at least a conducting pad and at least an interconnection structure. In one embodiment, a lens may be disposed on the optoelectronic device 102. For example, the lens 105 may be disposed on the insulating layer 104 to be substantially aligned with the optoelectronic device 102. The lens 105 may be used to assist in the entering and/or exiting of light. The lens 105 may be, for example, a micro-lens array.

Then, a substrate 110 may be optionally disposed on the surface 100a of the substrate 100. The substrate 110 is, for example, a transparent substrate such as a glass substrate, quartz substrate, transparent polymer substrate, or combinations thereof. In one embodiment, the size and the shape of the substrate 110 may be similar to those of the substrate 100.

In one embodiment, the substrate 100 and the substrate 110 may be optionally separated from each other by a spacer layer 108. The spacer layer 108 may be formed in advance on the substrate 110 or the substrate 100. The spacer layer 108 may be, for example, an insulating material such as a polymer material, ceramic material, or combinations thereof. In one embodiment, all together the spacer layer 108, the substrate 100, and the substrate 110 may surround a cavity 109 on the optoelectronic device 102. The lens 105 may be located in the cavity 109 without directly contacting the substrate 110.

Then, the substrate 100 may be optionally thinned to facilitate subsequent process steps. For example, the substrate 110 may be used as a support, and a thinning process may be performed from the surface 100b of the substrate 100 to thin down the substrate 100 to an appropriate thickness. The thinning process may be, for example, a mechanical grinding process, chemical mechanical polishing process, or combinations thereof.

In one embodiment, a conducting layer electrically connected to the conducting pad structure 106 may then be formed on the substrate 100. In one embodiment, a through substrate conducting structure electrically connected to the conducting pad structure 106 may be formed in the substrate 100. For example, by using a photolithography process and an etching process, a portion of the substrate 100 may be removed from the surface 100b of the substrate 100 to form a through-hole 112 extending towards the conducting pad structure 106. Then, an insulating layer 114 may be formed on the surface 100b of the substrate 100. The insulating layer 114 may be, for example, silicon oxide, silicon nitride, silicon oxynitride, polymer material, or combinations thereof. The insulating layer 114 may be formed by using, for example, a vapor deposition process, applying process, or thermal oxidation process. The insulating layer 114 may extend into the through-hole 112 to be located on the sidewall and the bottom of the through-hole 112. Then, by using a photolithography process and an etching process, the insulating layer 114 at the bottom of the through-hole 112 and the insulating layer 104 thereunder may be removed such that a portion of the conducting pad structure 106 is exposed.

Then, a conducting layer 116 is formed on the surface 100b of the substrate 100. The conducting layer 116 may extend into the through-hole 112 to electrically contact with the conducting pad structure 106 exposed by the through-hole 112. The material of the conducting layer 116 is, for example, (but is not limited to) copper, aluminum, gold, nickel, tungsten, or combinations thereof. The conducting layer 116 may be formed by using, for example, a physical vapor deposition process, chemical vapor deposition process, electroplating process, electroless plating process, or combinations thereof. In one embodiment, the conducting layer 116 may be patterned according to requirements through a photolithography process and an etching process.

In one embodiment, the through-hole 112 may have an "inverted angle structure". That is, the width of the through-hole 112 increases along a direction from the surface 100b towards the surface 100a. Through the adjustment of the etching condition, the formed through-hole 112 may have the "inverted angle structure". In another embodiment, the width of the through-hole 112 decreases along a direction from the surface 100b towards the surface 100a, as shown in FIG. 2A. In yet another embodiment, the sidewall of the through-hole 112 may be substantially perpendicular to the surface 100b of the substrate 100.

As shown in FIG. 2A, after the conducting layer 116 is formed, a light shielding layer 118 is formed on the surface 100b and the conducting layer 116. In one embodiment, a solution (such as a polymer solution) used for forming the light shielding layer 118 may be applied on the surface 100b of the substrate 100 to form a light shielding material layer. Then, the light shielding material layer may be patterned according to requirements. For example, the light shielding material layer may be a material layer capable of being patterned, such as a photoresist layer (ex. a black photoresist layer). Thus, an exposure process and a development process may be performed to the light shielding material layer to form the light shielding layer 118 having a desired pattern. In one embodiment, the light shielding layer 118 may be a negative type photoresist layer. In one embodiment, the light shielding layer 118 may have at least an opening exposing the conducting layer 116. In one embodiment, the light shielding layer 118 may have a light shielding rate of more than about 80%. For example, the light shielding rate of the light shielding layer 118 may range from between 80% and 99.9%, 85% and 99.5%, or 90% and 99%. Usually, the light shielding rate of the light shielding layer 118 determines the light shielding degree of the visible light and/or the IR light. However, in another application, the light shielding rate of the light shielding layer 118 may indicate the light shielding degree of the UV light, the X-ray, or another radiation light having a shorter wavelength.

The light shielding layer 118 may assist in blocking and/or absorbing light coming from the outside of the chip package, especially light coming from behind the surface 100b of the substrate 100, thus facilitating operation of the optoelectronic device 102. For example, if the optoelectronic device 102 is an image sensor device, the light shielding layer 118 may block and/or absorb light coming from the surface 100b of the substrate 100 to prevent image noise from occurring. Alternatively, if the optoelectronic device 102 is a light emitting device, the light shielding layer 118 may block and/or absorb light coming from the surface 100b of the substrate 100 to prevent the wavelength and/or the intensity of light emitted by the chip package from being affected by external light.

Then, a conducting bump 120 electrically contacting with the conducting layer 116 may be formed in the opening of the light shielding layer 118, which exposes the conducting layer 116. The light shielding layer 118 may, for example, directly contact with the conducting bump. In one embodiment, a solder material may be filled into the opening of the light shielding layer 118. Then, a reflow process may be performed to the solder material to form the conducting bump 120. In one embodiment, the conducting bump 120 may completely fill the opening of the light shielding layer 118. In one embodiment, an under bump metallurgy layer (not shown) may be formed between the conducting bump 120 and the conducting layer 116.

In one embodiment, all together the light shielding layer 118 and the conducting bump 120 may substantially completely cover the surface 100b of the substrate 100 to ensure that the external light does not enter the substrate 100 from the surface 100b of the substrate 100 to negatively affect the operation of the optoelectronic device 102.

Next, a dicing process may be performed along the predetermined scribe lines SC to form a plurality of chip packages 10 separated from each other, as shown in FIG. 2B. In the chip package 10, because there is no solder resist layer with high stress or solder resist layer containing fillers disposed below the light shielding layer 118, cracks and/or voids forming in the light shielding layer 118 may be prevented from occurring and/or reduced. The light shielding performance of the light shielding layer 118 is therefore ensured to improve the performance and the reliability of the chip package.

In the embodiment in FIG. 2B, the light shielding layer 118 may directly contact with the conducting layer 116 and may be substantially and conformally located on the conducting layer 116 on the sidewall of the through-hole 112. However, embodiments of the invention are not limited thereto and may have many variations. For example, FIGS. 3A-3C are cross-sectional views showing chip packages according to embodiments of the present invention, wherein same or similar reference numbers are used to designate same or similar elements.

Figure 3C:
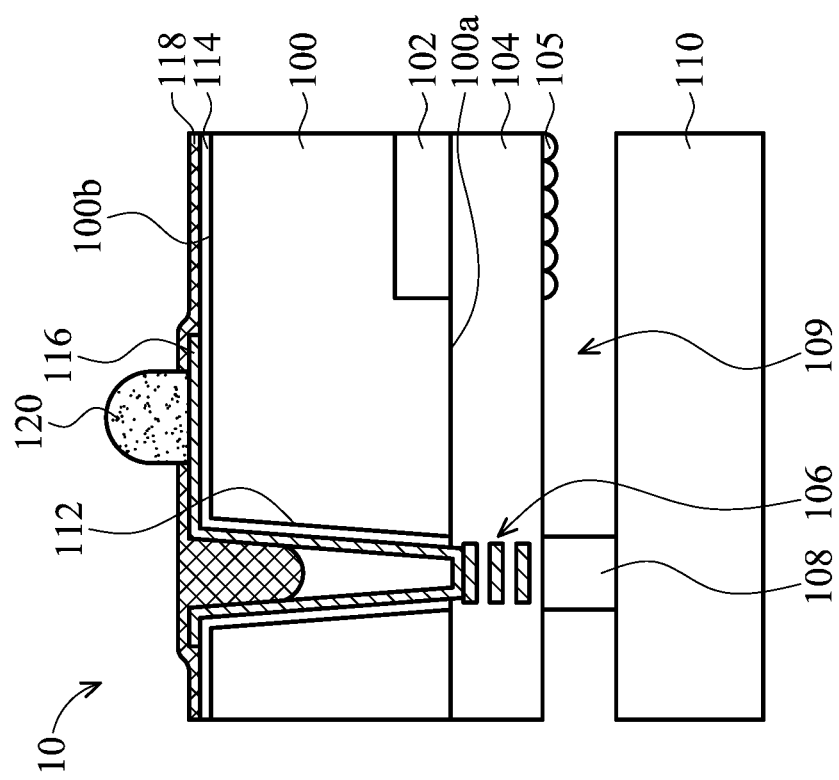

As shown in FIG. 3A, in one embodiment, the light shielding layer 118 may only cover the through-hole 112 and substantially does not fill the through-hole 112. In another embodiment, the light shielding layer 118 may fill the through-hole 112. For example, in the embodiment in FIG. 3B, the light shielding layer 118 may completely fill the through-hole 112. Alternatively, as shown in FIG. 3C, in one embodiment, the light shielding layer 118 may partially fill the through-hole 112 and a space is left.

In the chip package of embodiments of the invention, the light shielding layer is used to block and/or absorb external light such that operation of the chip package is better. In the chip package of embodiments of the invention, the light shielding layer does not contact with a solder resist layer with high stress, thus the problem of light leakage may be prevented. In addition, in the chip package of embodiments of the invention, because no solder resist layer with high stress is formed on the conducting layer, fabrication cost and time may be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a substrate having a first surface and a second surface;
    an optoelectronic device formed in the substrate;
    a through-hole extending from the second surface to the first surface;
    a conducting layer disposed on the substrate;
    an insulating layer disposed between the substrate and the conducting layer;
    a light shielding layer disposed on the second surface of the substrate and directly contacting with the conducting layer, wherein the light shielding layer has a light shielding rate of more than about 80% and has at least an opening exposing the conducting layer, and wherein there is no solder resist material contacting with the conducting layer and the light shielding layer on the second surface; and
    a conducting bump disposed in the opening of the light shielding layer to electrically contact with the conducting layer, wherein all together the light shielding layer and the conducting bump substantially and completely cover the second surface of the substrate,
    wherein the through-hole is partially filled with the light shielding layer such that a void is formed between a bottom of the through-hole and the light shielding layer in the through-hole, and wherein a portion of the conducting layer, which overlies both sidewalls and the bottom of the through-hole, directly contacts the void.

2. The chip package as claimed in claim 1, wherein the insulating layer extends along a sidewall of the through-hole and extends onto the second surface of the substrate, and the conducting layer extends on the insulating layer in the through-hole.

3. The chip package as claimed in claim 2, wherein the light shielding layer is substantially and conformally disposed on the conducting layer on the sidewall of the through-hole.

4. The chip package as claimed in claim 2, wherein the light shielding layer covers the through-hole.

5. The chip package as claimed in claim 1, wherein the light shielding layer directly contacts with the conducting bump.

6. The chip package as claimed in claim 1, wherein the conducting bump completely fills the opening of the light shielding layer.

7. The chip package as claimed in claim 1, further comprising a transparent substrate disposed on the first surface of the substrate.

8. The chip package as claimed in claim 7, further comprising a spacer layer disposed between the substrate and the transparent substrate, wherein all together the spacer layer, the substrate, and the transparent substrate surround a cavity on the optoelectronic device.

9. A method for forming a chip package, comprising:
    providing a substrate having a first surface and a second surface, wherein at least an optoelectronic device is formed in the substrate;
    forming a through-hole extending from the second surface to the first surface;
    forming an insulating layer on the substrate;
    forming a conducting layer on the insulating layer on the substrate, wherein the conducting layer is electrically connected to the at least an optoelectronic device;
    forming a light shielding layer on the second surface of the substrate, wherein the light shielding layer directly contacts with the conducting layer and has at least an opening exposing the conducting layer, and the light shielding layer has a light shielding rate of more than about 80%, and wherein there is no solder resist material contacting with the conducting layer and the light shielding layer on the second surface; and
    forming a conducting bump in the at least an opening of the light shielding layer to electrically connect to the conducting layer, wherein all together the light shielding layer and the conducting bump substantially and completely cover the second surface of the substrate,
    wherein the through-hole is partially filled with the light shielding layer such that a void is formed between a bottom of the through-hole and the light shielding layer in the through-hole, and wherein a portion of the conducting layer, which overlies both sidewalls and the bottom of the through-hole, directly contacts the void.

10. The method for forming a chip package as claimed in claim 9, wherein the through-hole is formed by removing a portion of the substrate from the second surface of the substrate to form the through-hole extending towards the first surface of the substrate before the insulating layer is formed, and wherein the insulating layer extends on a sidewall of the through-hole, and the conducting layer extends on the insulating layer in the through-hole.

11. The method for forming a chip package as claimed in claim 10, wherein the light shielding layer extends on the conducting layer in the through-hole.

12. The method for forming a chip package as claimed in claim 9, further comprising performing a dicing process along a plurality of predetermined scribe lines on the substrate to form a plurality of chip packages separated from each other.

13. The method for forming a chip package as claimed in claim 9, wherein the formation of the conducting bump comprises:
    filling a solder material into the at least an opening of the light shielding layer; and
    performing a reflow process to the solder material to form the conducting bump.

14. The method for forming a chip package as claimed in claim 9, further comprising disposing a transparent substrate on the first surface of the substrate.

15. The method for forming a chip package as claimed in claim 14, further comprising disposing a spacer layer between the substrate and the transparent substrate, wherein all together the spacer layer, the substrate, and the transparent substrate surround a cavity on the optoelectronic device.

16. The method for forming a chip package as claimed in claim 9, wherein the formation of the light shielding layer comprises:
    applying a polymer solution on the second surface of the substrate to form a light shielding material layer; and
    performing an exposure process and a development process to the light shielding material layer to form the light shielding layer.

* * * * *